United States Patent [19]

Clemente et al.

[11] Patent Number: 5,436,794
[45] Date of Patent: Jul. 25, 1995

[54] INDUSTRIAL CONTROLLER CARD RACK WITH HEAT TRANSFER ACROSS CARD EDGES

[75] Inventors: Joel C. Clemente, Mequon; Brian Fleischman, Eagle; John Kitscha, Brookfield; Paul Wied, Milwaukee, all of Wis.

[73] Assignee: Allen-Bradley Company, Inc., Milwaukee, Wis.

[21] Appl. No.: 298,805

[22] Filed: Aug. 31, 1994

[51] Int. Cl.⁶ .................. H05K 7/20; H05K 5/00
[52] U.S. Cl. .................. 361/704; 174/51; 361/753; 361/799
[58] Field of Search .............. 174/51; 361/690, 704, 361/707, 709–711, 715, 717–718, 722, 725, 728, 730, 732, 752, 753, 759, 796–802, 816, 818

[56] References Cited

U.S. PATENT DOCUMENTS 4,920,453  4/1990  Onose et al. .................. 361/826
5,343,361  8/1994  Rudy, Jr. et al. ............... 361/799

Primary Examiner—Gregory D. Thompson
Attorney, Agent, or Firm—Keith M. Baxter; John J. Horn; H. F. Hamann

[57] ABSTRACT

A rack for an industrial controller has a metallic top and bottom plate with grooves to receive circuit cards of functional modules. A heat sink on the functional modules has flanges forming parts of the edge of the circuit cards that engage the grooves of the rack to provide a direct path of conduction from the heat sinks to the rack augmenting the cooling of the heat sink normally provided by heat sink fins. The heat sink stands away from the circuit card and has cantilevered flanges returning to the circuit card surface that provide flexure ensuring good contact between the heat sink and the grooves on the rack.

7 Claims, 1 Drawing Sheet

U.S. Patent        July 25, 1995        5,436,794
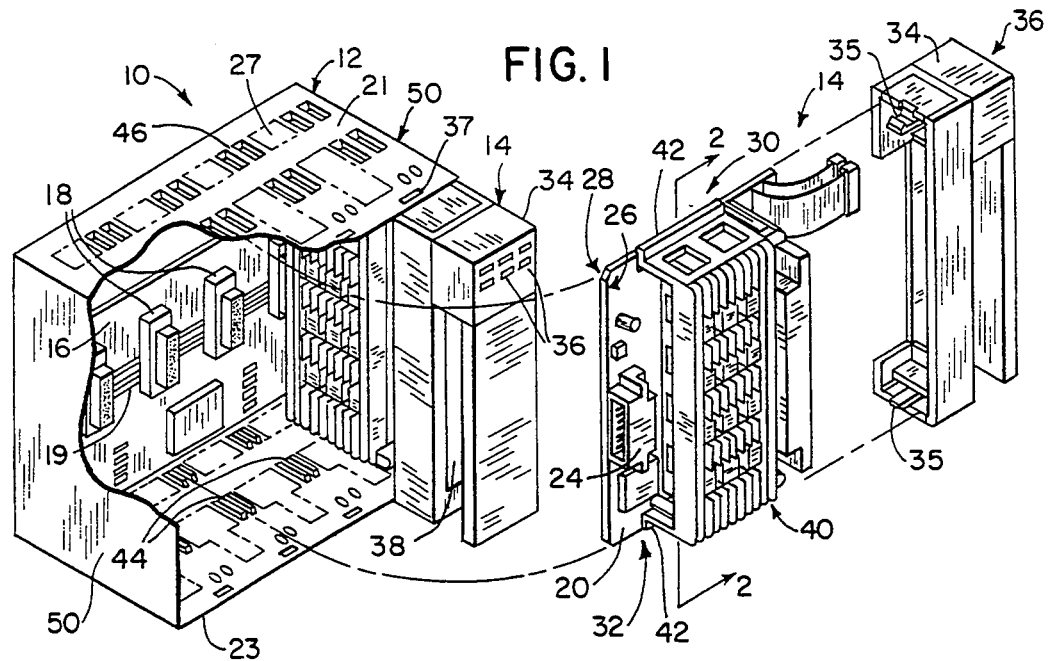

INDUSTRIAL CONTROLLER CARD RACK WITH HEAT TRANSFER ACROSS CARD EDGES

FIELD OF THE INVENTION

The present invention relates to industrial controllers made up of multiple modules contained within a rack, and in particular, to a rack assembly providing improved heat transfer from the modules in the rack.

BACKGROUND OF THE INVENTION

Industrial controllers are special purpose computers used for controlling industrial processes in manufacturing equipment.

Under the direction of a stored program, the industrial controller examines a series of inputs, reflecting the status of the controlled process, and changes outputs effecting control of the industrial process. The inputs and outputs are most simply binary, that is on or off; however analog inputs and outputs assuming a value within a continuous range of values are also available.

In contrast to a computer, normally an industrial controller is "customized" to the particular process it is controlling, both by writing new control software that may be stored in the controller's memory, and by changing the hardware configuration of the controller to match the control task. The ability to change the hardware configuration is provided economically by dividing the industrial controller into a number of modules, each performing a different function. The modules may include a processor, a power supply, a communications port, and one or more input or output interface modules. The modules needed for a particular control task may be selectively linked together on a common backplane within a rack. In a typical hardware modification, additional input or output interface modules may be added to the rack so as to permit the control of additional or different kinds of equipment.

The input or output interface modules provide a means of converting between high power signals from or to the industrial process and low power digital signals that may be communicated along the backplane of the rack to the processor. For example, an "AC output" module may provide for the control of AC signals through a set of internal triacs which are controlled by low voltage digital signals received via the rack's backplane from the processor module. The triacs, or other similar power devices used in such input and output interface modules, generate heat as a result of their small but finite resistance in the on state and during the switching between off and on states. Ordinarily this heat is dissipated into the air surrounding the module and carried off by convection as the air moves through the open frame of the rack.

With a general reduction in the size of electronic circuitry and the development of compact industrial controllers, the ability to dissipate heat generated by the modules has been much reduced. The smaller size of the rack and modules both reduces the air flow through the industrial controller. Further, the small size of the rack increases the possibility of detrimental heat flow from one module to its neighbors. Because it is intended that the modules be freely mixed within a rack, such intermodule conduction places significant limits on the amount of heat that may be dissipated to the confines of the rack.

It is well known to provide for more heat dissipation by the use of forced air from fans or the like. Nevertheless, such a modification to the entire rack, by incorporating a fan and air conduits, is undesirable as it adversely and unnecessarily increases the cost of simple controller configurations which may not employ modules requiring high heat dissipation. Further, the need for a special rack limits the use of high heat dissipation modules in preexisting compact racks. Preferably, increased heat dissipation capability should be provided only when required, in a manner that minimizes the increase in cost to the basic system, and in a manner that is compatible with an installed base of systems and racks already in existence.

SUMMARY OF THE INVENTION

The present invention provides a method of augmenting the heat dissipation capacity of a module in an industrial controller by extending tabs from its heat sink that may be received by the guide channels of the rack to provide a direct path of heat conduction from the heat sink to the metal of the rack without increasing heat dissipation within the rack.

Specifically, the invention is a multi-card assembly for an industrial control system having an enclosure with a back wall supporting a first electrical connector. The enclosure also has two opposed thermally conducting side walls flanking and abutting the back wall. A circuit card with a second electrical connector has edges spaced to be slideably received along the side walls in contact with the side walls when the circuit card is inserted along an insertion axis between the side walls allowing connection of the first and second electrical connectors. A heat sink is attached to heat generating components on the circuit card and forms a portion of the edges of the circuit card so that heat from the components on the circuit card can be conducted through the heat sink directly to the enclosure when the circuit card is within the enclosure. The heat sink may also have cooling fins.

It is thus one object of the invention to provide a simple means of augmenting heat conduction out of high heat dissipation modules without requiring special racks or increasing internal heat dissipation. By having the tabs on the heat sink mimic the edge of the card normally received by the rack, a path of heat conduction out of the rack may be developed which does not require modification of the rack.

It is another object of the invention to provide a means of enhanced heat dissipation that is compatible with the need for the modules to electrically connect by a rear panel connector system. Providing the heat conduction to the edges of the card allows the card to be inserted within the rack to a depth determined solely by the electrical connector and yet to ensure a path of heat conduction to the rack walls regardless of the insertion depth.

The heat sink may be electrically conductive and attached to the circuit ground of the circuit module to provide an electrical path to the enclosure of the housing.

Thus, it is another object of the invention to provide both improved heat dissipation and electrical shielding.

The portion of the edges provided by the heat sink may be configured to spring inward away from the side wall when the circuit module is inserted within the enclosure.

Thus, it is another object of the invention to ensure good thermal contact between the heat sink and the enclosure that accommodates wear and reasonable manufacturing tolerances and that securely holds the circuit module within the enclosure without adversely affecting the ease with which the module may be inserted and removed from the enclosure.

The heat sink may include a heat sink plate extending generally parallel to an axis between the card edges to contact the heat generating components on the card and to absorb heat therefrom and having heat dissipating fins to disperse the heat into the air. The heat sink plate may further have a first and second end opposed along the axis. At least two posts attached to the circuit card and extending outward from the face of the circuit card may support the heat sink plate away from the circuit card and at least one cantilevered arm extending from one of the ends of the heat sink plate back to the circuit card may terminate with a flange providing the portion of the edge of the circuit card that may flex inward toward the center of the circuit board.

Thus, it is another object of the invention to provide a monolithic heat sink that may readily attach to circuit components extending out from a circuit board and yet provide flexible edge portions mimicking the edge of the circuit card without the need for separate joints and spring assemblies.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference must be made therefore to the claims herein for interpreting the scope of the invention.

BRIEF DESCRIPTION OF THE DRAWINGS

FIG. 1 is a perspective exploded cutaway view of an industrial controller showing a module of the present invention having a heat sink and that may be received by a rack.

FIG. 2 is a cross section of the heat sink along line 2—2 of FIG. 1 showing the connection between the heat dissipating devices and the heat sink and a cantilevered portion forming flexible edges to the circuit card of the circuit module; and FIG. 3 is a cross section along line 3—3 of FIG. 2 showing the interfitting of the heat sink and a groove in the rack.

DETAILED DESCRIPTION OF THE PREFERRED EMBODIMENT

Referring to FIG. 1, a multi-module industrial controller 10 includes generally a rack 12 substantially in the form of a box with five walls and having an open side to receive one or more functional modules 14.

A back wall of the rack 12 opposite the open side of the rack 12 is formed by a printed circuit board which provides an electrical backplane 16 which supports one or more multi-pin electrical connectors 18 to provide for electrical communication between functional modules 14 inserted in the rack 12. The connectors 18 are joined by means of conductors 19 and backplane control circuitry (not shown) as is well known in the art.

Top and bottom side walls 21 and 23 extending out from the backplane 16 in parallel opposition about the backplane 16 are constructed of heat conductive material such as sheet metal and include convection slots or apertures 27 which permit air flow in a generally vertical direction through the rack 12. Channels or grooves 44 and 46 are formed on the inner opposed faces of the top and bottom side walls 21 and 23 to guide and hold functional modules 14 in the rack 12 as will be described. The channels 44 and 46, and convection slots 27 may be formed directly in the top and bottom side walls 21 and 23 by means of a press and die as is understood in the art. Two remaining walls 50 joining the backplane 16 and the top and bottom side walls 21 and 23 are preferably constructed of molded thermoplastic material.

Referring still to FIG. 1, a functional module 14 that may be inserted in the rack 12 includes a circuit card 20 on which heat dissipating components 22 may be mounted. Circuit card 20 is constructed of epoxy fiber glass laminate as is well known in the art and has one or more layers of conductor on its front or back face 26 and 28, respectively, which serve to connect the components 22. A face panel 34 is mounted on the front edge of the circuit card 20 and provides status indicator lights 36 and screw terminals 38 for connection of the functional module 14 to the controlled machinery or process. A connector 24 mounted at the rear edge of the circuit card 20 is of a size and shape to connect with one of connectors 18 on the backplane 16.

Top and bottom edges 30 and 32 of the functional module 14 are defined by the edges of the circuit card 20 and the edges of a heat sink 40 positioned over the front face 26 of the circuit card 20, as will be described. Generally, the functional module 14 may slide into the rack 12, the edges 30 and 32 being guided by corresponding channels 44 and 46 which align the functional module 14 for insertion so that connector 24 may properly align with connector 18 on the backplane 16 for that particular set of channels 44 and 46. The top and bottom side walls 21 and 23 may flex outward slightly and the edge of the heat sink 40 may flex inward slightly (as will be described) to accommodate insertion and removal of the circuit card 20.

The functional module 14, as depicted and as will be further described, is an AC output card used for controlling AC power. However, as will be understood from the following description, the present invention is generally applicable to a variety of functional modules 14 such as may have heat dissipating components 22. Multiple channels 44 and 46 and multiple connectors 18 provide positions where other functional modules 14 may be inserted to complete the industrial controller 10.

Referring now to FIGS. 1, 2 and 3, the heat sink 40 includes a generally planar rectangular heat sink plate 52 having a plurality of fins 54 extending from the heat sink plate 52 away from the front face 26 of the circuit card 20, the fins 54 providing a set of vertical channels through which cooling convective air may pass such as is well known in the art. The surface of the heat sink plate 52 toward the front face 26 of the circuit card 20 includes webs 57 against which triacs or other heat dissipating components 22 may be mounted by means of spring clips 58. As is understood in the art, a thermally conductive but electrically insulating paste and tab (not shown) may be placed between the component 22 and the web 57 to enhance thermoconductivity and to limit the possibility of an electrical short between the component 22 and the heat sink 40.

The heat sink plate 52 is supported parallel to but above the front face 26 of the circuit card 20 by means of four posts 60 extending from the corners of the heat sink plate 52 to the front surface of the circuit card 20.

The posts 60 are held to the circuit card 20 by means of machine screws 62 passing through the circuit card 20 and received by a threaded hole in the base of each post 60. The machine screw 62 may contact a conductor 64 on the back face 28 of the circuit card 20 providing circuit ground for the components of the functional module 14. Thus electrical communication is provided between the circuit ground and the heat sink 40 which will ultimately be communicated to the rack 12 to provide electrical shielding.

At either end of the heat sink plate 52 toward the respective edges 30 and 32 of the functional module 14, a cantilevered arm 63 extends from the heat sink plate 52 toward the front face 26 of the print circuit card 20. The end of each arm 63 holds a flange 42 which extends along the plane of the circuit card 20 within notches cut in the edges of the circuit card 20 to accommodate the flanges 42. The flanges 42 provide the edges 30 and 32 of the functional module 14 near the mid portion of the circuit card 20.

The cantilevered arms 63 provide some springiness allowing the flanges 42 to move inward as indicated by arrows 66 so as to provide a slight pressure against the top and bottom side walls 21 and 23. This pressure is augmented by the slight flexure of the side walls 21 and 23 when the functional module 14 is inserted in the rack 12. When the functional module 14 is installed in the rack 12, the edges 30 and 32 formed by the flanges 42 and the adjacent edges of the circuit card 20 are received in the channels 46 and 44, respectively. The flange 42 protrudes along the plane of the circuit card 20 further than the edge of the circuit card to ensure that the heat sink 40 is in constant contact with the metallic surfaces of the top and bottom side walls 21 and 23 when the functional module 14 is in place in the rack 12.

The components of the heat sink 40 including the heat sink plate 52, the fins 54, the web 57, the posts 60 and the arms and flanges 63 and 42 may be advantageously cast as a single part increasing reliability and decreasing manufacturing cost.

The relative heat dissipation into the air from fins 54 and into the rack 12 may be controlled to ensure that the heating of adjacent modules is minimized. Orientation of the rack 12 in the circuit modules 14 to promote vertical air flow and the separation of the modules horizontally further reduces inter-module heat transfer.

Many other modifications and variations of the preferred embodiment which will still be within the spirit and scope of the invention will be apparent to those with ordinary skill in the art. In order to apprise the public of the various embodiments that may fall within the scope of the invention, the following claims are made.

I claim:

1. A multi-card assembly for an industrial control system comprising:
    (a) an enclosure having a backwall supporting at least one first electrical connector, the enclosure also having two opposed and thermally conducting sidewalls flanking and abutting the back wall;
    (b) a circuit card having a second electrical connector, and having edges spaced to be slidably received along the sidewalls in contact with the sidewalls when the circuit card is inserted along an insertion axis between the sidewalls to connect the first and second electrical connectors; and
    (c) a heat sink attached to heat generating components on the circuit card and having heat sink edges adjacent and coplanar with the edges of the circuit card, the heat sink edges spaced to be slidably received along the sidewalls in contact with the sidewalls when the circuit card is inserted along the insertion axis;
    wherein heat from the components on the circuit card is conducted through the heat sink to the enclosure when the circuit card is within the enclosure.

2. The assembly of claim 1 wherein the sidewalls have opposed grooves extending along the insertion axis and sized to receive the edges of the circuit card to guide the first electrical connector into connection with the second electrical connector when the circuit card is inserted in the enclosure.

3. The assembly of claim 1 wherein sidewalls for the top and bottom of the enclosure include apertures permitting the vertical flow of air through the enclosure and wherein the heat sink includes a plurality of fins arrayed to provide vertical channels through which air may flow to absorb heat from the heat sink.

4. The assembly of claim 1 wherein the circuit card includes a circuit ground conductor and wherein the heat sink is connected to the circuit ground and provides an electrical path between the circuit ground and the sidewalls when the circuit card is positioned within the enclosure.

5. The assembly of claim 1 wherein a portion of the edges formed by the heat sink spring inward away from an adjacent sidewall to maintain contact with the sidewall without preventing sliding along the insertion axis.

6. The assembly of claim 1 wherein the sidewalls are constructed of sheet metal of a gauge to flex outward away from an adjacent edge of the circuit card to maintain contact with the edge without preventing sliding of the circuit card along the insertion axis.

7. The assembly of claim 1 wherein the circuit card includes a printed circuit board having the heat generating components mounted on a front side; and
    wherein the heat sink includes:
    (a) a heat sink plate extending generally parallel to an axis between the card edges to contact the heat generating components to absorb heat therefrom and having a plurality of heat dissipating fins, the heat sink plate further having first and second ends opposed along the axis;
    (b) at least two posts attached to the front side of the circuit board and extending outward from the front side to support the heat sink plate; and
    (c) at least one cantilevered arm extending from one of the first and second ends of the heat sink plate back toward the top side terminating with a flange providing the portion of the edge of the circuit card; wherein the cantilevered edge may flex inward toward a center of the circuit board.

* * * * *